US008633782B2

(12) United States Patent  
Nagarkatti et al.

(10) Patent No.: US 8,633,782 B2  
(45) Date of Patent: *Jan. 21, 2014

(54) RADIO FREQUENCY POWER DELIVERY SYSTEM

(75) Inventors: Siddharth P. Nagarkatti, Acton, MA (US); Michael Kishinevsky, North Andover, MA (US); Ali Shajii, Canton, MA (US); Timothy E. Kalvaitis, Nashua, NH (US); William S. McKinney, Jr., Cambridge, MA (US); Daniel Goodman, Lexington, MA (US); William M. Holber, Winchester, MA (US); John A. Smith, North Andover, MA (US)

(73) Assignee: MKS Instruments, Inc., Andover, MA (US)

( * ) Notice: Subject to any disclaimer, the term of this patent is extended or adjusted under 35 U.S.C. 154(b) by 126 days.

This patent is subject to a terminal disclaimer.

(21) Appl. No.: 12/786,763

(22) Filed: May 25, 2010

(65) Prior Publication Data

US 2010/0231296 A1 Sep. 16, 2010

Related U.S. Application Data

(63) Continuation of application No. 11/554,979, filed on Oct. 31, 2006, now Pat. No. 7,764,140.

(60) Provisional application No. 60/731,797, filed on Oct. 31, 2005.

(51) Int. Cl.  
*H03H 7/38* (2006.01)

(52) U.S. Cl.  
USPC .................. 333/17.3; 333/32; 315/111.21

(58) Field of Classification Search  
USPC ............ 315/111.21; 333/17.3, 32; 118/712, 118/723 E; 156/345, 44, 28; 438/9  
See application file for complete search history.

(56) References Cited

U.S. PATENT DOCUMENTS 4,871,421 A 10/1989 Ogle et al.  
5,053,725 A * 10/1991 Gesche et al. ............... 333/17.3

(Continued)

FOREIGN PATENT DOCUMENTS

EP 0788633 A1 8/1997  
JP H03-194893 6/2007

(Continued)

OTHER PUBLICATIONS

Dixon, "Average Current Mode Control of Switching Power Supplies," Unitrode Application Note U-140, (1999), pp. 3-356-3-369.

(Continued)

*Primary Examiner* — Tung X Le  
(74) *Attorney, Agent, or Firm* — Proskauer Rose LLP

(57) ABSTRACT

A system and method are provided for delivering power to a dynamic load. The system includes a power supply providing DC power having a substantially constant power open loop response, a power amplifier for converting the DC power to RF power, a sensor for measuring voltage, current and phase angle between voltage and current vectors associated with the RF power, an electrically controllable impedance matching system to modify the impedance of the power amplifier to at least a substantially matched impedance of a dynamic load, and a controller for controlling the electrically controllable impedance matching system. The system further includes a sensor calibration measuring module for determining power delivered by the power amplifier, an electronic matching system calibration module for determining power delivered to a dynamic load, and a power dissipation module for calculating power dissipated in the electrically controllable impedance matching system.

17 Claims, 14 Drawing Sheets

(56) References Cited

U.S. PATENT DOCUMENTS

| | | | |
|---|---|---|---|
| 5,556,549 A * | 9/1996 | Patrick et al. | 216/61 |
| 5,654,679 A | 8/1997 | Mavrectic et al. | |
| 5,846,885 A | 12/1998 | Kamata et al. | |
| 5,936,481 A | 8/1999 | Fujii | |
| 6,472,822 B1 * | 10/2002 | Chen et al. | 315/111.21 |
| 6,781,317 B1 | 8/2004 | Goodman | |
| 6,791,274 B1 * | 9/2004 | Hauer et al. | 315/111.21 |
| 6,887,339 B1 | 5/2005 | Goodman et al. | |
| 7,122,965 B2 | 10/2006 | Goodman | |
| 7,304,438 B2 | 12/2007 | Kishinevsky | |
| 7,312,584 B2 | 12/2007 | Tamita et al. | |
| 7,405,521 B2 * | 7/2008 | Dhindsa et al. | 315/111.21 |
| 2001/0027843 A1 | 10/2001 | Komino et al. | |
| 2003/0196601 A1 | 10/2003 | Murayama et al. | |
| 2004/0000875 A1 * | 1/2004 | Vahedi et al. | 315/111.71 |
| 2005/0093459 A1 | 5/2005 | Kishinevsky | |
| 2006/0232471 A1 | 10/2006 | Coumou | |
| 2007/0008745 A1 | 1/2007 | Joshi et al. | |

FOREIGN PATENT DOCUMENTS

| | | |
|---|---|---|
| WO | WO 01/43282 | 6/2001 |
| WO | WO 2006/124734 | 11/2006 |
| WO | WO 2007/053569 | 5/2007 |

OTHER PUBLICATIONS

Ishizuka et al., "A Design of a Low-Delay DPWM Control Circuit for DC-DC Converter," Telecommunications Energy Conference, 29th International, IEEE, (2007), pp. 342-347.

Entley, W.R., "Optimizing utilization efficiencies in electronegative discharges: The importance of the impedance phase angle," Nov. 1999.

* cited by examiner

RADIO FREQUENCY POWER DELIVERY SYSTEM

RELATED APPLICATION

This application is a continuation of U.S. patent application Ser. No. 11/554,979, filed on Oct. 31, 2006, which claims the benefit of U.S. Provisional Application No. 60/731,797, filed on Oct. 31, 2005, the entire teachings of which are incorporated herein by reference.

BACKGROUND

Various approaches exist for providing RF power to dynamic loads. RF generators provide power to dynamic loads typically at frequencies between about 400 kHz and about 200 MHz. Frequencies used in some scientific, industrial and medical applications are approximately 2 MHz, 13.56 MHz and 27 MHz.

As shown in FIG. 1A, one system 100 for providing RF power to dynamic loads (i.e., a plasma load 140) involves a fixed frequency RF generator 110 and a two-axis tunable matching network 120 connected by a 50Ω transmission line 130. The tunable matching network 120 includes a series motorized vacuum variable capacitor 122 and inductor 124 and a shunt motorized vacuum variable capacitor 126. The algorithm used to determine the series and shunt capacitance is based on impedance measurements typically made using a magnitude and phase detector 150. Independent power control is based on power measurements at the RF generator 110. The power control loop 160 and impedance control loop 162 are independent.

As shown in FIG. 1B, another system 100' for providing RF power to dynamic loads involves a fixed element matching network 120' fed by an RF generator 110 and connected by a 50Ω transmission line 130. The fixed element matching network 120' includes a series capacitor 122 and inductor 124 and a shunt capacitor 126. The frequency of the RF generator 110 can be tuned to a certain range (e.g., 13.56 MHz±5%). The RF generator 110 frequency command is based on the value of voltage standing wave ratio (VSWR). The independent power loop and VSWR (impedance) control loop 160' are based on measurements at the output of the RF generator 110.

As shown in FIG. 1C, another system 100" for providing RF power to dynamic loads involves an integrated RF generator-impedance matching network 120". The RF generator-impedance matching network 120" includes a series capacitor 122 and inductor 124 and a plurality of shunt capacitor 126a ... 126n. The shunt capacitor 126a ... 126n are coupled to a switching circuit 127a ... 127n that couples and decouples the capacitors 126 to ground. The power control and frequency control 160" of the system 100" are not conducted simultaneously.

SUMMARY

These prior art techniques and methods have disadvantages. Higher cost is typically associated with prior art techniques and methods due to the need for at least two separate modules: 1) the RF generator/amplifier and 2) the impedance matching network, which are to be connected via a transmission line. Furthermore, each module requires a RF voltage/current sensor or a magnitude/phase detector.

Plasma impedance is a function of the power delivered to the plasma. Furthermore, the power delivered by the RF generator is a function of the impedance "seen" by the generator. As a result, a clear circular interdependence exists between delivered power and load impedance yielding a multi-input-multi-output (MIMO) system with cross-coupling. In prior art systems, the RF generator control loop and the impedance matching control loop are independent and thus cannot compensate for the cross-coupling between power control and impedance matching control loops. This leads to poor closed-loop performance.

The dynamic response of any controlled system is only as fast as the slowest functional module (sensor, actuator, or control system parameters). In prior art systems, the slowest functional module is typically the DC power supply. Specifically, the DC power supplied to the input of the RF power amplifier usually includes a large electrolytic capacitor that is used to filter higher frequencies. The downside of using such a filter network is that the dynamic response (e.g., response to a step change in power command) is slow regardless of the control update rate. The system is therefore unable to sufficiently compensate for plasma instabilities.

In systems that use a vacuum capacitor driven by motors, the response time is on the order of hundreds of milliseconds. Owing to the fact that plasma transients (sudden and rapid change of impedance) of interest occur within hundreds of microseconds, the vacuum capacitor cannot be used to match load changes attributed to plasma transients.

Control algorithms for matching networks used in the prior art have relied upon the real and imaginary components of the measured impedance. Impedance measurement-based matching control suffers from an inherent disadvantage. For example, a change in shunt capacitance to correct or modify the real component of the impedance results in an undesirable change in the imaginary component of the impedance. Similarly, a change in the series capacitance or frequency to correct or modify the imaginary component of the impedance results in an undesirable change in the real component of the impedance. The matrix that relates the controlled variable vector (formulated by the real and imaginary components of the impedance) and the controlling variable vector (formulated by the shunt and series capacitance or the shunt capacitance and frequency) is non-diagonal. Impedance measurement-based control algorithms are therefore not effective. Control algorithms based on the impedance formulated by using magnitude and phase measurements of the impedance are similarly ineffective.

Calibration methods for prior art systems calibrate the RF impedance analyzer or VI probe at the input of the electronic matching network. These calibration methods assume the power loss in the electronic matching network is fixed for all states of the electronic matching network and operating frequencies. However, the losses of the electronic matching network contribute significantly to the overall system operation.

Accordingly, a need therefore exists for improved methods and systems for controlling power supplied to a dynamic plasma load and the losses associated therewith.

There is provided a system for delivering power to a dynamic load. The system includes a power supply providing DC power having a substantially constant power open loop response, a power amplifier for converting the DC power to RF power, a sensor for measuring voltage, current and phase angle between voltage and current vectors associated with the RF power, an electrically controllable impedance matching system to modify the impedance of the power amplifier to at lease substantially match an impedance of a dynamic load, and a controller for controlling the electrically controllable impedance matching system. The system further includes a sensor calibration measuring module for determining power delivered by the power amplifier, an electronic matching system calibration module for determining power delivered to a dynamic load, and a power dissipation module for calculating power dissipated in the electrically controllable impedance matching system.

In one embodiment, the electrically controllable impedance matching system can include an inductor, a capacitor in series with the inductor, and a plurality of switched capacitors in parallel with the dynamic load. The inductor can be a multiple tap-type inductor or a variable-type inductor. Each of the plurality of switched capacitors can be in series with a switch and an additional capacitor. In another embodiment, the electrically controllable impedance matching system can include a capacitor, and a plurality of switched capacitors in parallel with the dynamic load, wherein each of the plurality of capacitors is in series with a switch and an additional capacitor. In yet another embodiment, the electrically controllable impedance matching system can control the frequency of the impedance matching between the power amplifier and the dynamic load.

In one embodiment, the controller can control the electrically controllable impedance matching system for simultaneous control of conductance and susceptance associated with the impedance between the power amplifier and the dynamic load. In another embodiment, the controller can simultaneously control RF power frequency, RF power magnitude and the impedance between the power amplifier and the dynamic load. In yet another embodiment, the controller can control the electrically controllable impedance matching system for regulating conductance and susceptance to setpoints that stabilize an unstable dynamic load.

The power dissipated in the electrically controllable impedance matching system is the difference between the power delivered by the power amplifier and the power delivered to the dynamic load. The power delivered to the dynamic load is a sum of the power delivered to a resistive load and the power dissipated inside the load simulator.

The sensor calibration measuring module calibrates the sensor into a resistive load, wherein the resistive load is 50Ω. The electronic matching module calibrates an output of the electrically controllable impedance matching system into a load simulator. The load simulator can be an inverse electrically controllable impedance matching system. The electronic matching system calibration module can include a power meter calibration module for determining power delivered to a resistive load; and a load simulator calibration module for determining power dissipated inside the load simulator. The resistive load can be 50Ω. The radio frequency power delivery system provides at least the following advantages over prior art systems. The system can enhance power setpoint regulation, impedance matching, and load disturbance mitigation using high-speed (e.g., in excess of 50 kHz in one embodiment) digital multi-input-multi-output (MIMO) control. The system can operate in the presence of transient changes in plasma load properties and under conditions involving fast plasma stabilization. The system can provide a RF power delivery system that is robust to transients during startup of the system. The system can provide a high power step-up ratio, wherein the high power step-up ratio is 100 (e.g., 15W to 1500 W). The system can measure power delivered to the load connected to the output of the integrated generator system. The system can allow for regulation of power that is independent of the power loss variation associated with the state/value of various controlled variables. The system can eliminate the need for recipe-based calibration for plasma loads.

BRIEF DESCRIPTIONS OF THE DRAWINGS

The foregoing and other objects, features and advantages of the invention will be apparent from the following more particular description of preferred embodiments of the invention, as illustrated in the accompanying drawings. The drawings are not necessarily to scale, emphasis instead being placed upon illustrating the principles of the invention.

DETAILED DESCRIPTION

Figure 1A:
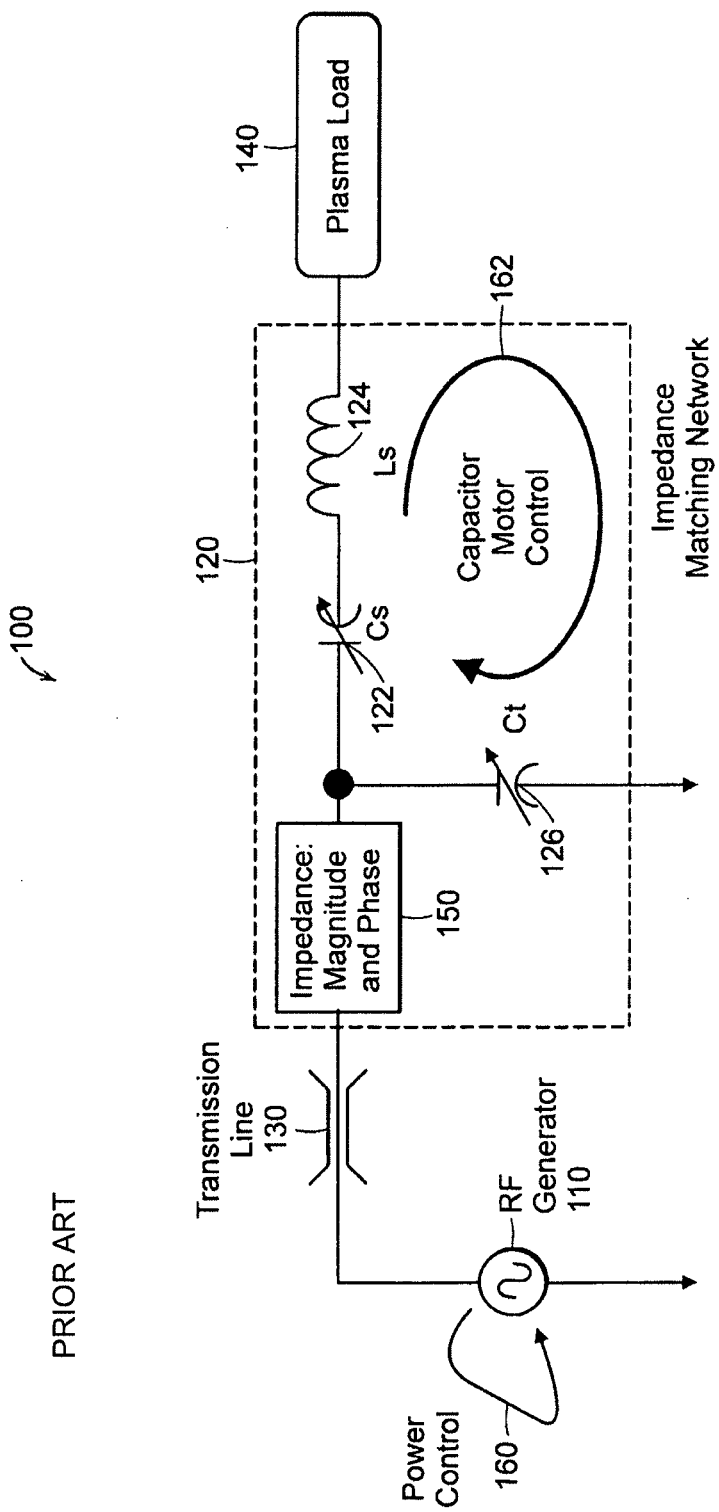
FIG. 1A is a diagram of an RF power delivery system having a two-axis tunable matching network according to the prior art.
Figure 1B:
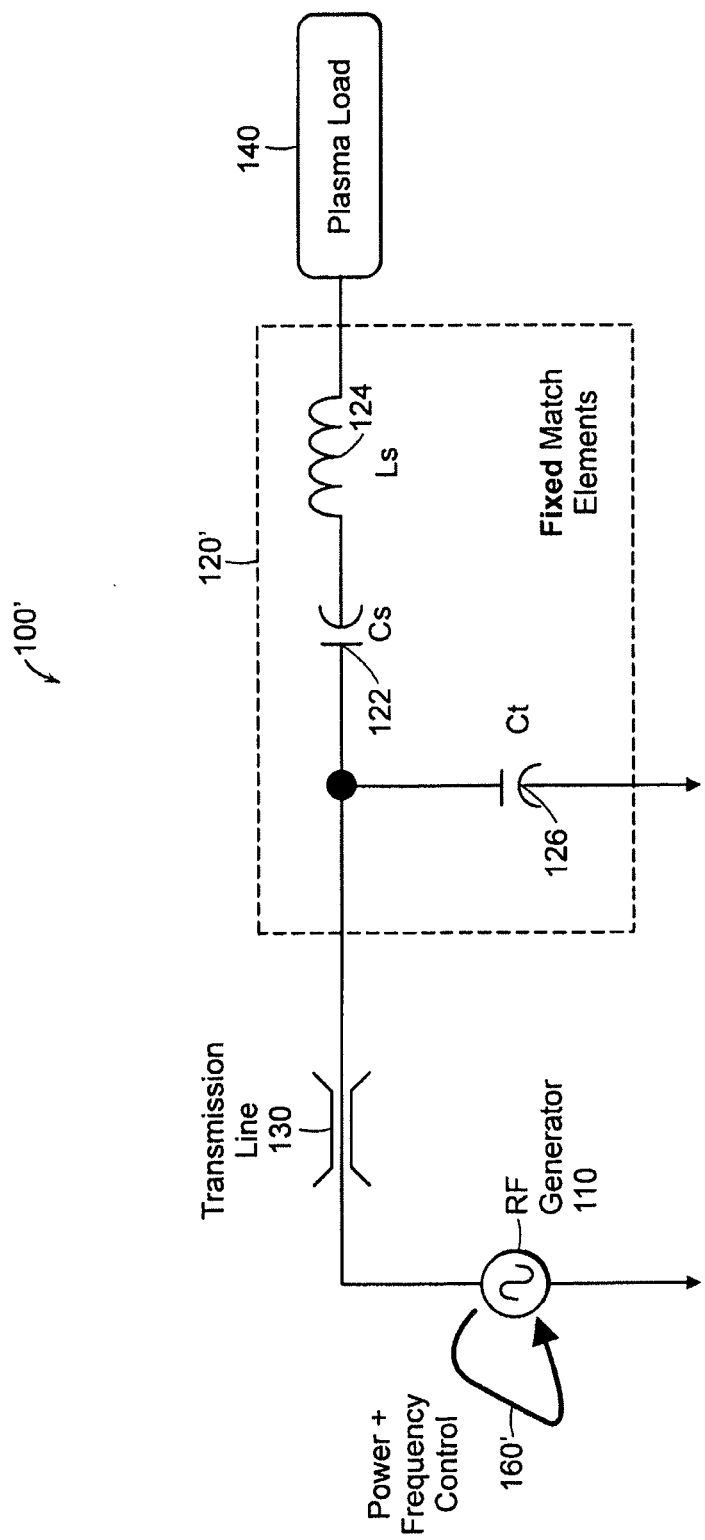
FIG. 1B is a diagram of an RF power delivery system having a fixed matching network according to the prior art.
Figure 1C:
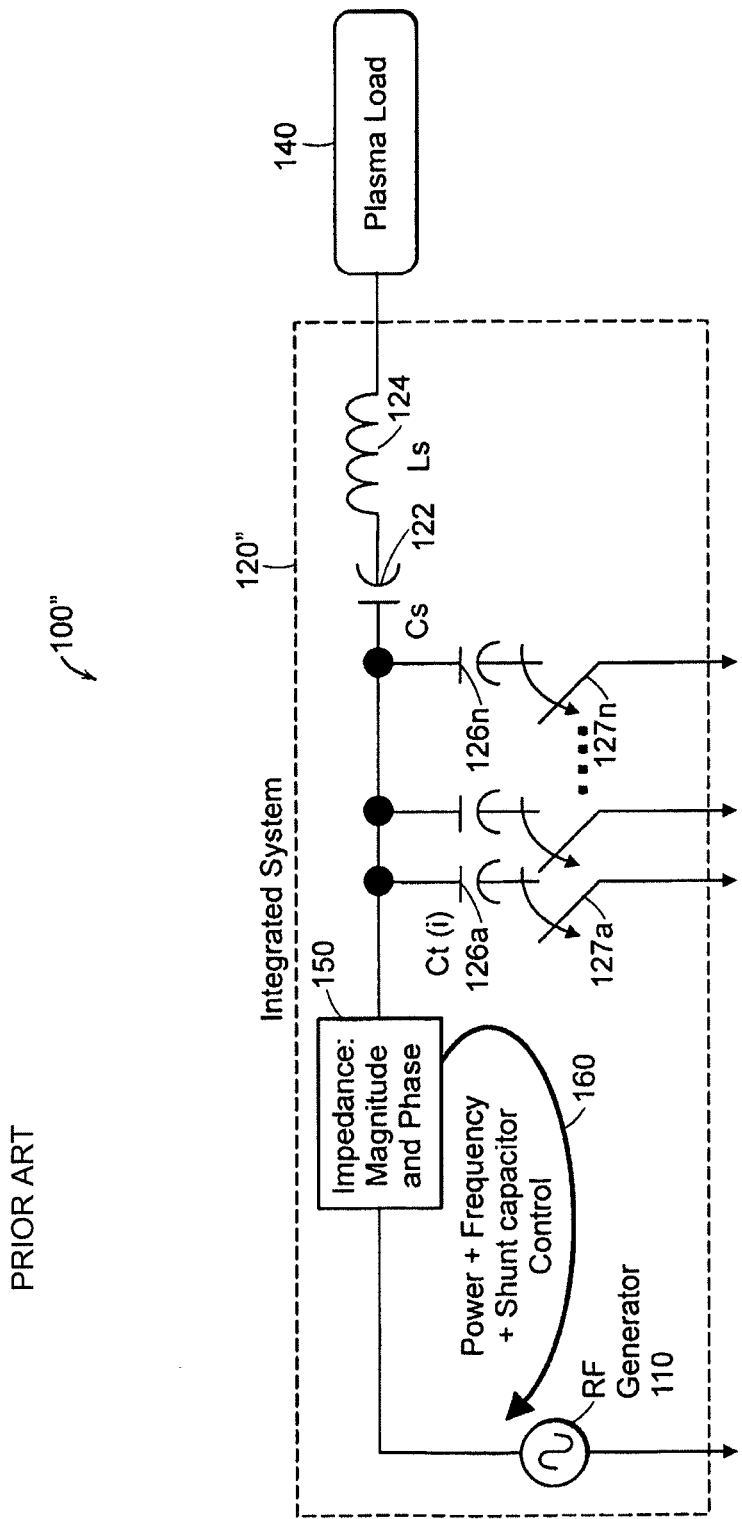
FIG. 1C is a diagram of an RF power delivery system having an integrated RF generator-impedance matching network according to the prior art.
Figure 2:
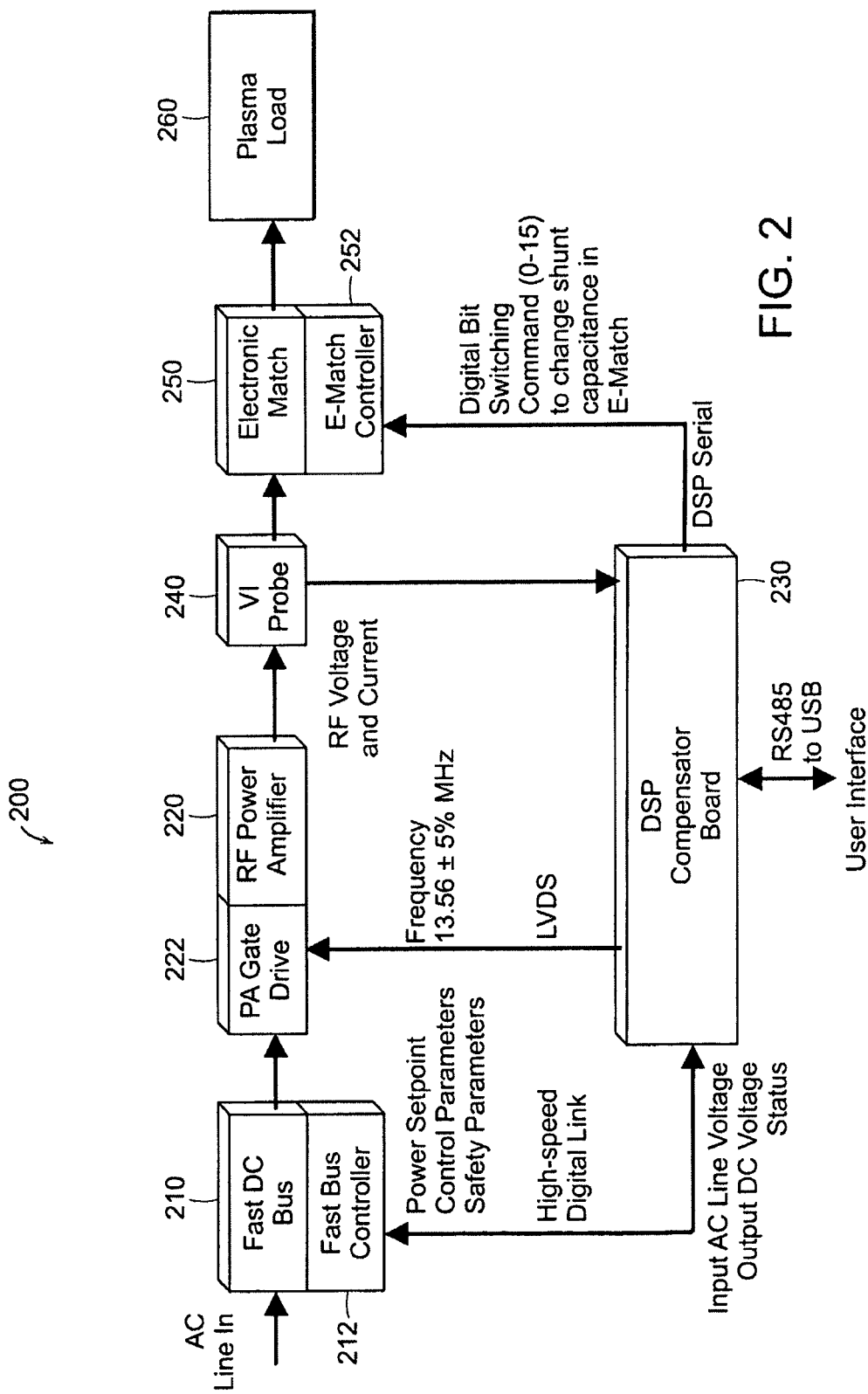
FIG. 2 is a module-based diagram of the On-Chamber RF power delivery system.

Generally, an integrated radio frequency (RF) power delivery system is provided for dynamic load applications (e.g., inductive and/or capacitive plasma load). FIG. 2 is an illustration of the integrated radio frequency (RF) power delivery system 200. Representative functional modules of the integrated system 200 include a fast DC bus 210, an RF power amplifier ("PA") 220, a digital signal processor ("DSP") compensator board 230, an RF impedance analyzer or VI probe 240, and an electronic matching network 250. The system 200 is coupled to a plasma load 260. It should be understood by one skilled in the art that the integrated system 200 can be implemented for a wide range of resistive and reactive loads.

Generally, the fast DC bus 210 delivers DC power to the power amplifier 220. The power amplifier 220 converts the DC power from the fast DC bus 210 to an RF power at a frequency. The electronic matching system 250 switches shunt capacitors (not shown) to match the impedance between the power amplifier 220 and the plasma load 260 to facilitate stable and maximum power transfer from the power amplifier 220 to the plasma load 260. The DSP compensator board 230 controls the operation of the system 200 based on measurements received from the fast bus controller 212 and RF impedance analyzer 240. The RF impedance analyzer 240 measures the RMS voltage, RMS current, and phase angle between the RF voltage and current vectors. Based on these measurements, relevant RF parameters are computed by the DSP compensator board 230. These parameters include, but are not limited to impedance vector $\bar{z}$, admittance vector $\bar{y}$, delivered power $P_{del}$, and voltage-standing wave ratio ("VSWR"). Typical operations of the DSP compensator board include power setpoints through the fast bus controller 212, RF power frequency setpoints through the power amplifier driver 222, and switching frequency through the electronic match controller 252.

Figure 3:
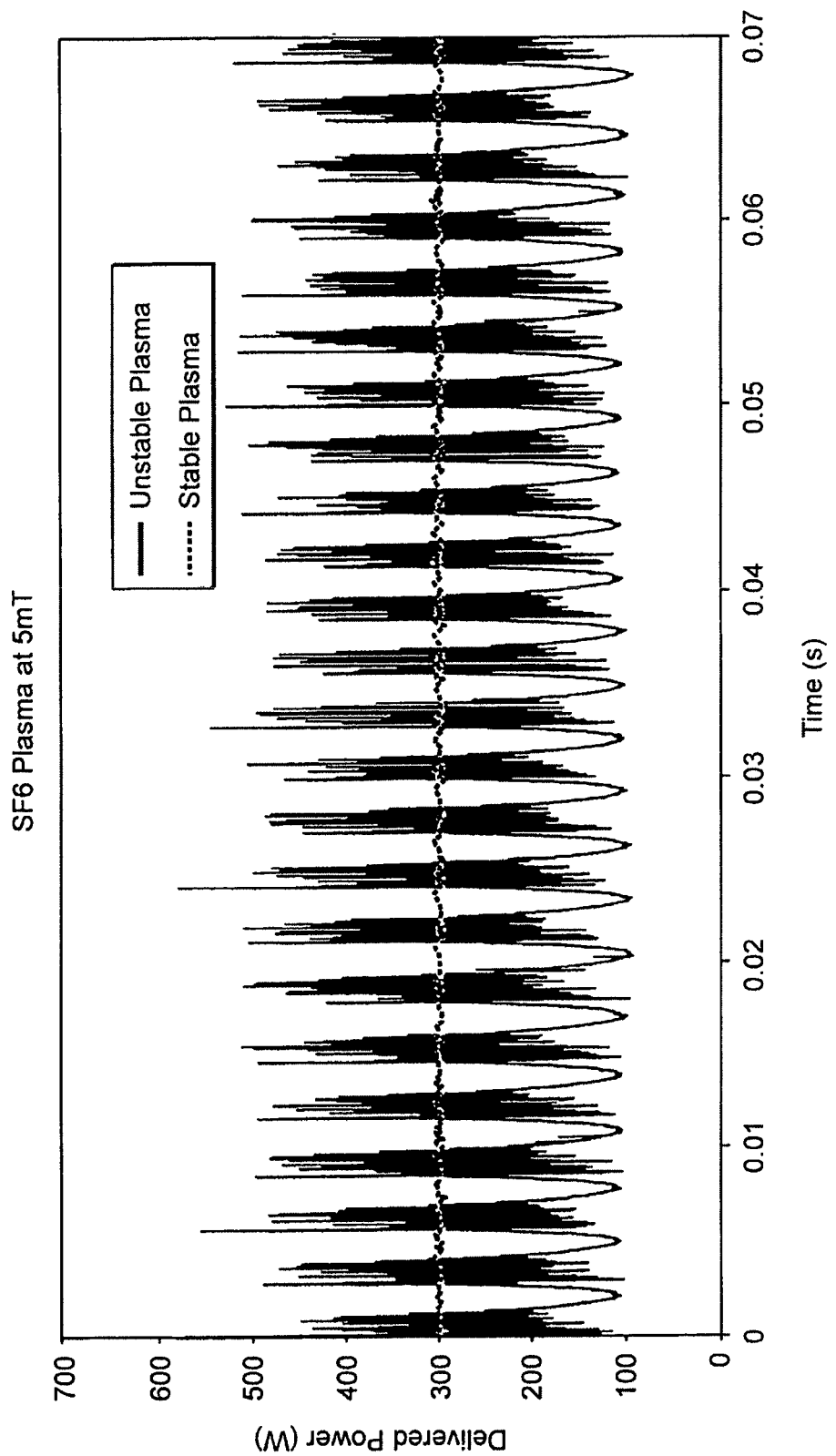
FIG. 3 is a plasma stability graph.

In one aspect, the system 200 achieves simultaneous power and impedance regulation. Independent susceptance regulation allows for the implementation of a frequency control algorithm based only on the deviation of the conductance from the conductance setpoint. As a result, both control loops can be operated simultaneously and at high-speed resulting in improved robustness. Further, well-known instabilities for electronegative plasmas at low-pressure (e.g., SF6 at 5 mT at 300W as illustrated in FIG. 3) can be stabilized by setting arbitrary conductance and susceptance setpoints in conjunction with operation of the Fast DC bus 210.

Figure 4:
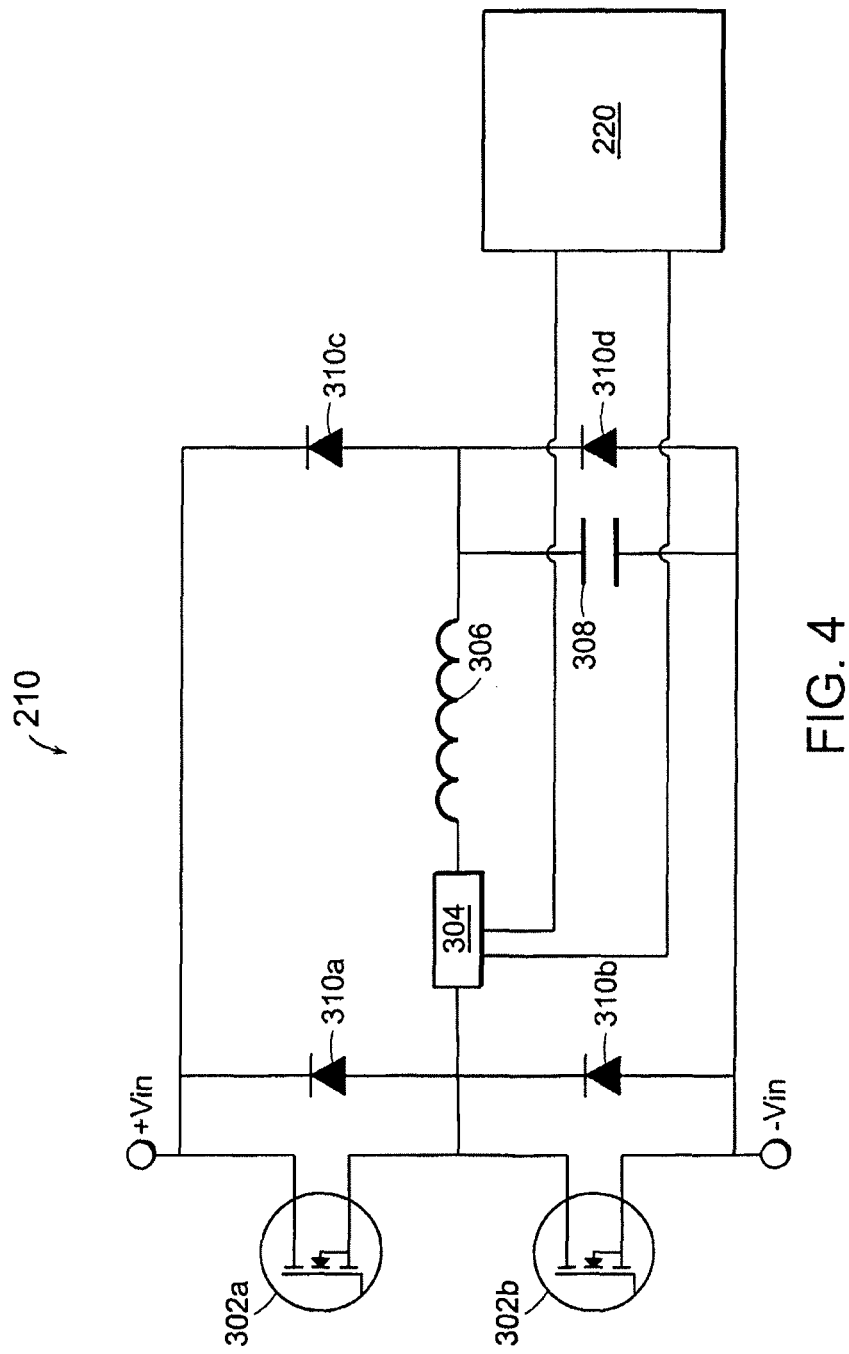
FIG. 4 is one embodiment of a fast DC bus of FIG. 2.

FIG. 4 is a diagram of a partial resonant inverter power supply type fast DC bus 210. The fast DC bus 210 provides process stability due to its associated constant power open loop response. The fast DC bus 210 improves FET utilization over the entire load space which results in more power being delivered to the load with the same PA 220 (FIG. 2). The fast DC bus 210 has a fast response rate allowing it to deliver increased power to the plasma so it does not extinguish while also allowing the flexibility to reduce the bus voltage to ensure the FETs on the PA 220 operate in a safe mode. Other types of topologies can for the fast DC bus 210 can be used. See for example, co-pending continuation-in-part application it's parent U.S. application Ser. No. 10/947,397 filed Sep. 22, 2004, the entire teaching of each application are herein incorporated by reference.

In one embodiment, the fast DC bus can be a partial resonant inverter 210 that includes a pair of switches (MOSFETs) 302a, 302b, an inductor (L) 306, a capacitor (C) 308, and four diodes 310a, 310b, 310c, and 310d. In operation, the partial resonant inverter 300 converts the input voltage into a square wave or other known type DC wave form. The square wave is passed through the inductor 306 and capacitor 308, the combination of which form an LC filter, clamped by the diodes 310c, 310d, coupled and rectified by a transformer rectifier 304 and filtered to obtain a desired DC voltage (power setpoint). The DC power setpoint is provided from the DSP compensator board 230 (FIG. 2). The desired impedance setpoint can be specified in terms of its vector inverse (referred to as admittance) and which constitutes simultaneous regulation of conductance to an arbitrary conductance setpoint and regulation of susceptance to an arbitrary susceptance setpoint. The output of the partial resonant inverter 300 (DC-DC converter) is connected to DC input of the RF power generator/amplifier 220.

In operation, the capacitor 308 is periodically charged to an input rail voltage (+Vin) and discharged while the capacitor current is passed via the plasma load 260 (FIG. 2). Every charge or discharge cycle, the energy deposited in the resistive load is equal to $CV^2/2$, independent of load resistance. Thus, the power is equal to $F_{SW} \times CV^2/2$, where $F_{SW}$ is the switching frequency and V is the input voltage. The inductor 306 ensures that the capacitor 308 is fully charged and discharged in finite time. One advantage of the partial resonant inverter 300 design is the ability to control the output voltage by varying either V or/and $F_{SW}$.

Figure 5:
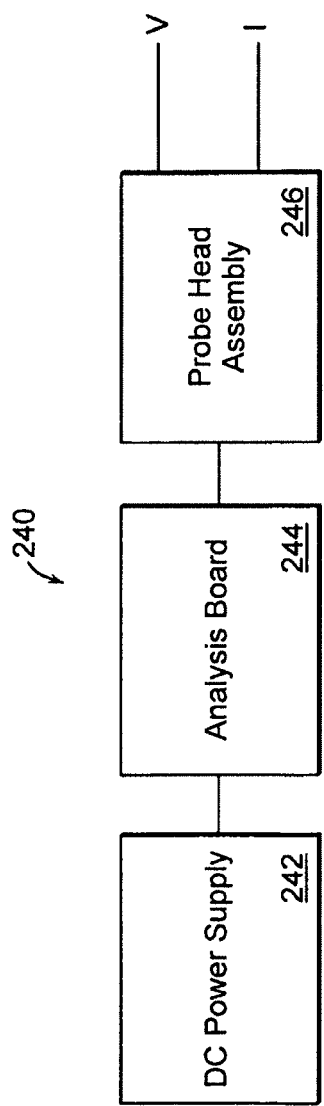
FIG. 5 is one embodiment of an RF impedance analyzer or VI Probe of FIG. 2

FIG. 5 is a diagram of one embodiment of an RF impedance analyzer or VI Probe 240. The VI Probe 240 includes a DC power supply 242, an analysis board assembly 244, and a probe head assembly 246. The analysis board assembly 244 receives low-level RF signals from the probe head assembly 246. The probe head assembly 246 provides two voltage outputs: 1) a voltage representation of the time varying electric field present in the probe head assembly 246 (voltage signal); and 2) a voltage representation of the time varying magnetic field present in the probe head assembly 246 (current signal). The analysis board assembly 244 receives and processes the two voltage outputs of the probe head assembly 246 and outputs the RF parameters to the DSP compensator board 230 (FIG. 2). MKS Instruments, Inc. VI-Probe-4100 and VI-Probe-350 are exemplary analyzers that can be used for this purpose.

Figure 6:
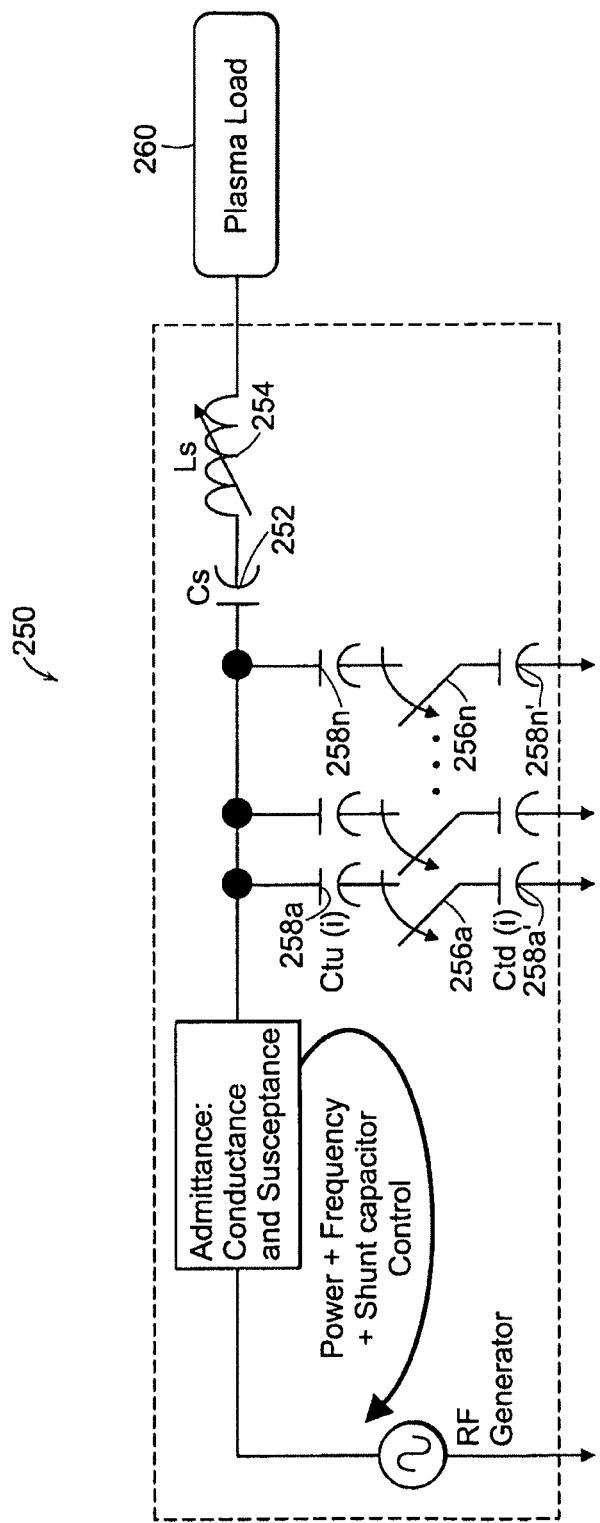
FIG. 6 is one embodiment of an electronic matching network of FIG. 2.

FIG. 6 is a diagram of one embodiment of an electronic matching network 250. In one embodiment, the electronic matching 250 includes an inductance 254 in series with the load 260 (e.g., a compact inductor with multiple tap points), a fixed or variable series-padding capacitor 252, and field effect transistors ("FET's") 256a . . . 256n that switch one or more upper capacitors $C_{tu}(i)$ 258a . . . 258n to a corresponding lower capacitor $C_{td}(i)$ 258a' . . . 258n', which is terminated to ground. In some embodiments, the electronic matching 250 network does not include the inductance 254 in series with the load 260. Other types of electronic matching networks can be used. See for example, U.S. Pat. No. 6,887,339, the entire teaching of which is herein incorporated by reference.

Figure 7:
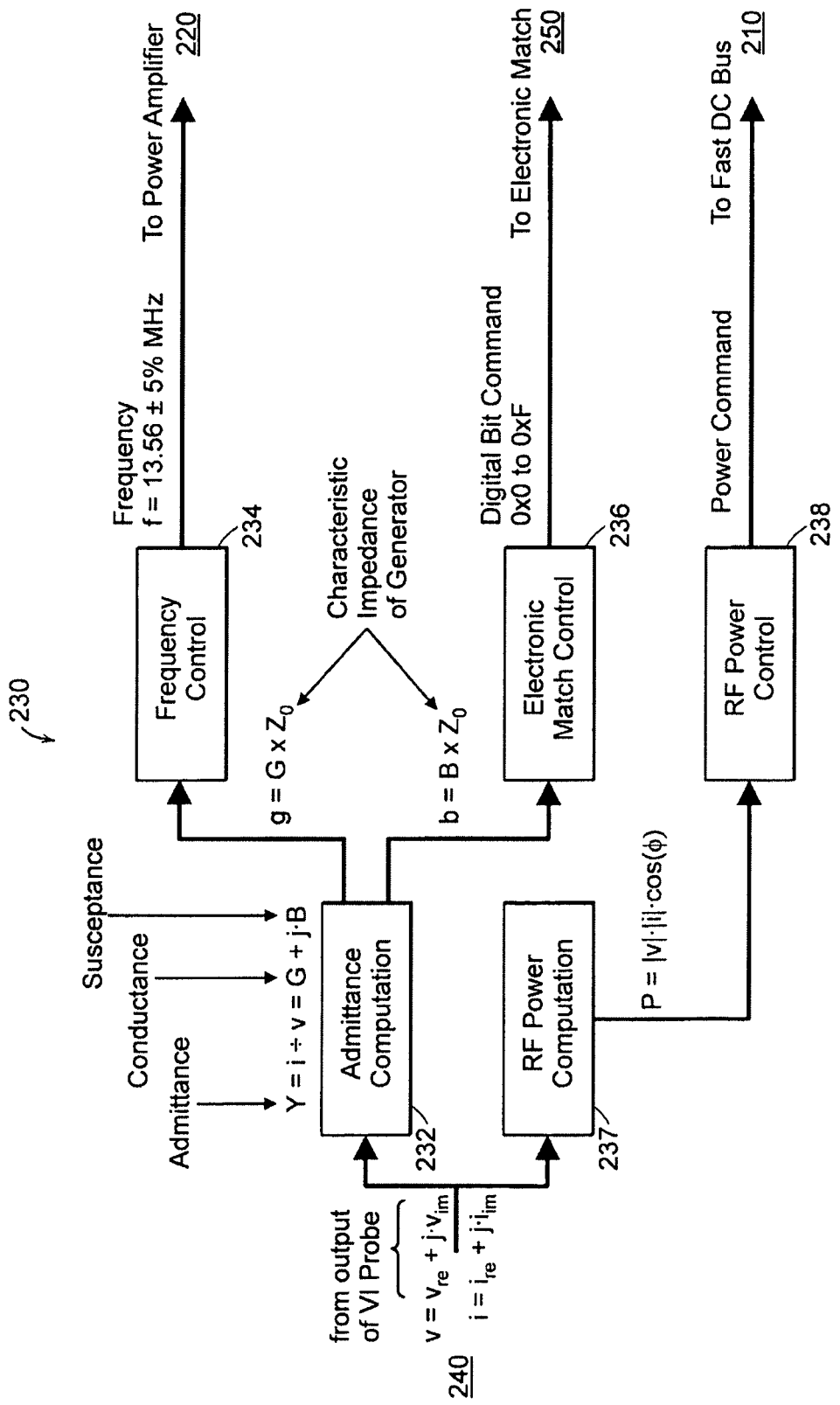
FIG. 7 is one embodiment of a module-based diagram of a DSP compensator board of FIG. 2.

FIG. 7 shows a module-based diagram of a DSP compensator board 230. The DSP compensator board 230 incorporates both a digital signal processor ("DSP") and a field programmable gate array ("FPGA"), and together controls the entire integrated system 200. The DSP compensator board includes an admittance compensation module 232, a frequency control module 234, an electronic match control module 236, an RF power computation module 237, and an RF power control module 238. Generally, the DSP compensator board receives the output from the VP probe 240. The admittance computation module 232 uses the VI probe outputs to calculate the admittance of the system 200. The frequency control module 234 uses the admittance to vary the frequency of the power amplifier 220. The electronic match control module 236 uses the admittance to switch the FETs 256 of the electronic matching network 250 on or off. The RF power computation module 237 uses the VI probe outputs to calculate the RF power of the system 200. The RF power control module 234 uses the RF power computation to regulate the power supplied from the fast DC bus power 210. A more detailed description of the operation of the system 200 is set forth below.

One embodiment of the power regulation objective and algorithm is set forth below: The objective is to regulate the delivered power $P_{del}$ a user-defined setpoint $P_{sp}$. To ensure smooth transitions, trajectory generators are used. In one embodiment, a first-order trajectory is generated as follows:

$$\frac{dP_t}{dt} = \frac{1}{\tau_t}(P_t(t) - P_{sp}) \qquad \text{EQN. 1}$$

where $\tau_t$ is the trajectory time constant and $P_t$ is the desired power trajectory. The delivered-power control algorithm, in terms of the change in power commanded to the Fast Bus, is given by the following relationship:

$$P_{cmd} = k_p(P_t - P_{del}) + k_i \int (P_t - P_{del}) dt \qquad \text{EQN. 2}$$

where $k_p$ and $k_i$ are are the proportional and integral gains, respectively.

Admittance regulation objective: A normalized admittance vector is defined as follows: $\bar{y} = g + jb$ where g is the normalized conductance and b is the normalized susceptance. The impedance matching control objective is formulated as follows: $g \to g_{sp}$ and $b \to b_{sp}$ where $g_{sp}$ and $b_{sp}$ are arbitrary setpoints selected to improve plasma stability. The above objective is reinterpreted in terms of impedance by noting that impedance is defined as the reciprocal of admittance, according to the following relationship:

$$z = \frac{1}{y} = r + jx = \frac{R + jX}{Z_0} = \frac{R + jX}{R_0 + j0} \qquad \text{EQN. 3}$$

where z is the normalized impedance, r and x are the resistance and reactance, respectively, $Z_0 = R_0 + j0$ denotes a nominal RF amplifier characteristic impedance. It follows that when $g \to 1$ and $b \to 0$, we obtain $R \to R_0$ and $X \to 0$.

Admittance regulation algorithm: The frequency control loop is designed by using conductance measurements, for example, as a PI control algorithm as follows:

$$f_{cmd} = -k_{pf}(g_{sp}-g) - k_{if}\int(g_{sp}-g)dt \qquad \text{EQN. 4}$$

where $k_{pf}$ and $k_{if}$ are scalar proportional and integral control gains. The shunt capacitance control loop is designed by using conductance measurements, for example, as a PI control algorithm as follows:

$$C_{tcmd} = -k_{pc}(b_{sp}-b) - k_{ic}\int(b_{sp}-b)dt \qquad \text{EQN. 5}$$

where $k_{pc}$ and $k_{ic}$ are scalar proportional and integral control gains.

In operation, referring now to FIGS. 2, 3 and 6, after the user provides a non-zero setpoint, the trajectory generator and the power and admittance control algorithms are simultaneously activated and executed. The VI probe 240 provides analog signals proportional to the RF voltage and RF current, which are synchronously sampled by the analog-to-digital converters, sent to a mixer and CIC filter (not shown) and ultimately sent through a calibration matrix to yield RF voltage and RF current measurements given by the following relationships:

$$\overline{V} = V_r + jV_i \text{ and } \overline{I} = I_r + jI_i \qquad \text{EQN. 6}$$

where $\overline{V}$, $\overline{I}$ denote vector representations of the instantaneous RF voltage and current, respectively, and subscripts r and i are used to denote the scalar values of the real and imaginary components.

The average delivered power is computed as follows:

$$P_{del} = \frac{1}{2}Re\{\overline{VI}^*\} = V_r I_r + V_i I_i \qquad \text{EQN. 7}$$

where $Re\{\ \}$ denotes the real component of the vector, and superscript * is used to denote the complex conjugate of the vector.

The admittance vector $\overline{Y}$ is then computed as follows:

$$\overline{Y} = \frac{\overline{I}}{\overline{V}} = \frac{(I_r V_r + I_i V_i)}{V_r^2 + V_i^2} + j\frac{(I_i V_r + I_r V_i)}{V_r^2 + V_i^2} \equiv G + jB \qquad \text{EQN. 8}$$

where the conductance G and the susceptance B are real and imaginary components of the admittance $\overline{Y}$.

The normalized conductance g and normalized susceptance b are computed as follows:

$$g = Z_0 G = Z_0 \frac{(I_r V_r + I_i V_i)}{V_r^2 + V_i^2} \text{ and} \qquad \text{EQN. 9}$$

$$b = Z_0 B = Z_0 \frac{(I_i V_r + I_r V_i)}{V_r^2 + V_i^2}$$

where $Z_0$ denotes the characteristic impedance of the RF amplifier. The measurements of $P_{del}$, g, b are respectively sent to the control algorithms for $P_{cmd}$, $f_{cmd}$, $C_{tcmd}$ respectively.

The electronic match controller 252 switches the FETs 256 (FIG. 6) thereby switching the shunt capacitors 258 to match the impedance between the power amplifier 20 and the dynamic load 260. The absence of moving mechanical parts leads to higher reliability. In one embodiment, the step response of the system 200 is faster than about 1 ms because the speed of the response is governed by the electronics and not by the mechanical response.

A change in frequency results in a change in both the conductance and the susceptance. However, for an integrated system without transmission line cables, a change in shunt capacitance results only in a change in the susceptance and does not affect the conductance value. Thus, the matrix that relates the controlled variable vector (formulated by the real and imaginary components of the admittance) and the controlling variable vector (formulated by the shunt and series capacitance or the shunt and frequency) is triangular. As a result, independent susceptance regulation is achieved by varying the shunt capacitance.

Independent susceptance regulation allows for the implementation of a frequency control algorithm based only on the deviation of the conductance from the conductance setpoint. As a result, both the conductance-based frequency control loop and the susceptance-based shunt capacitance control loop can be operated simultaneously and at high-speed, resulting in improved robustness.

Figure 8:
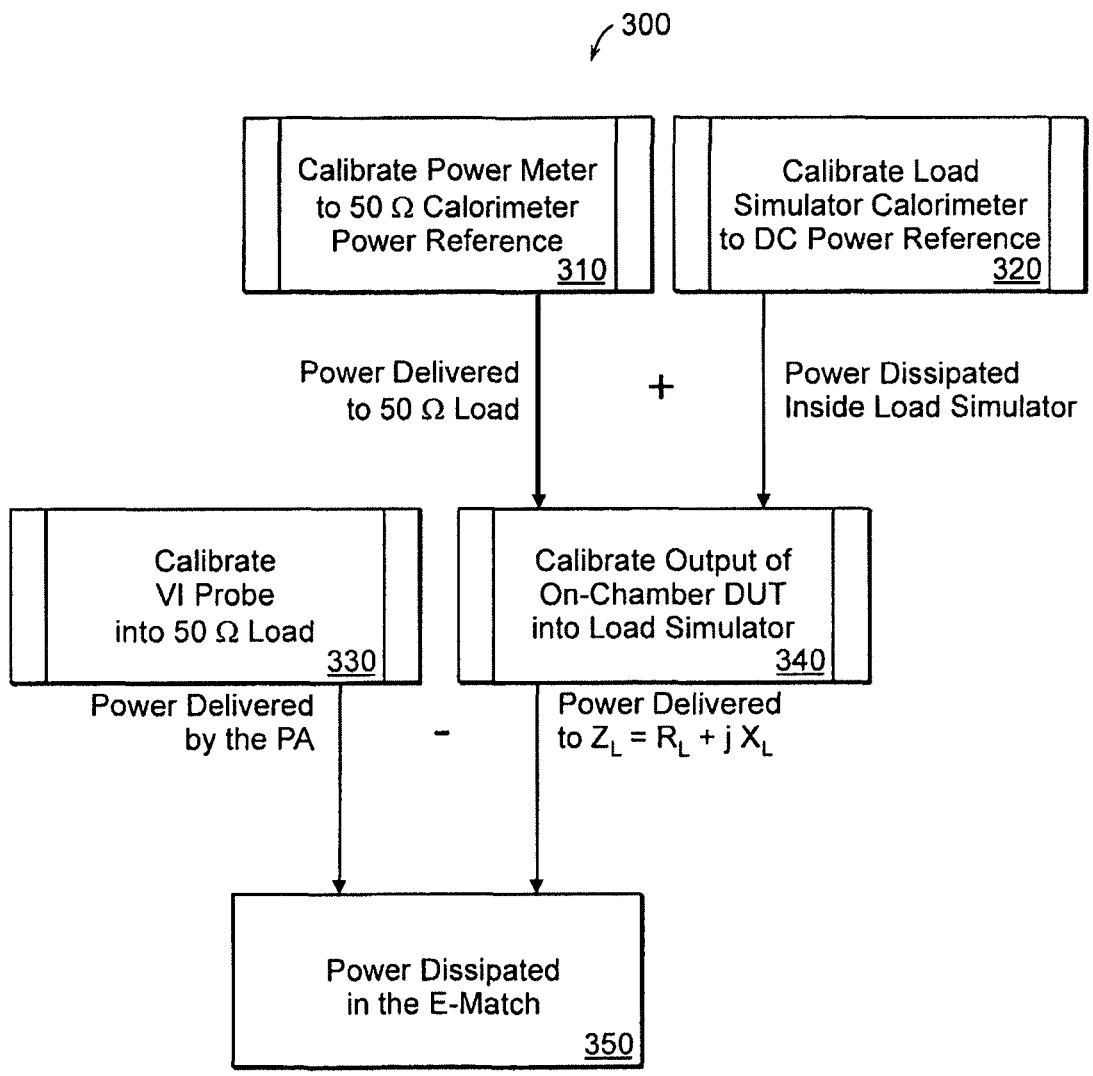
FIG. 8 is a block diagram for calibrating the On-Chamber RF power delivery system.
Figure 9A:
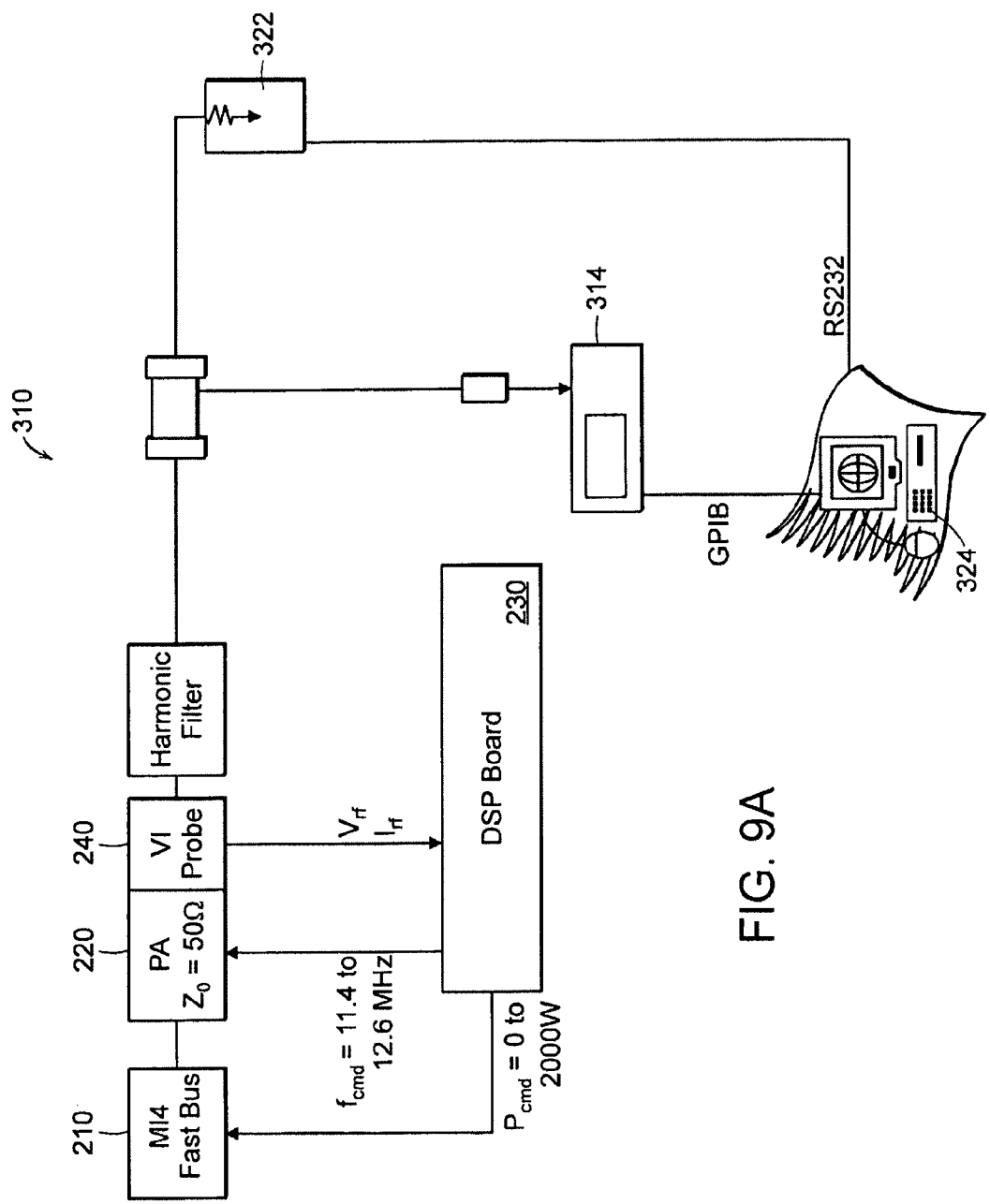
FIG. 9A is one embodiment for calibrating a power meter to a 50Ω calorimeter power reference.

FIG. 8 is a block diagram 300 of a method for determining the power dissipated (loss) in the electronic matching network 250 (FIG. 2) to improve the efficiency of the system 200. Step one (310), a power meter 314 (FIG. 9A) is calibrated into a 50Ω calorimeter power reference to determine the power delivered to the 50Ω load. Step two (320), a load simulator calorimeter 332 (FIG. 9B) is calibrated to a DC power reference to determine the power dissipated inside a load simulator 342 (FIG. 9D). Step three (330), the VI probe 240 (FIG. 2) is calibrated into a 50Ω load to determine the power delivered by the power amplifier 220 (FIG. 2). Step four (340), the output of the system 200 is calibrated into the load simulator 342 to determine the power delivered to $Z_L = R_L + jX_L$. Step 5 (350), the power dissipated in the electronic matching system is calculated by difference between the he power delivered by the power amplifier 220 and the power delivered to. $Z_L = R_L + jX_L$ FIG. 9A is detailed implementation diagram of step 310 for calibrating the power meter 314. A calorimeter 322 is coupled to the output of the VI Probe 240, RF power is applied from the power amplifier 220, and the power meter 314 is calibrated. Calorimetry is the measurement of thermal losses. It is implemented by thermally insulating the 50Ω load in the calorimeter (322) to prevent ambient thermal losses and measuring the flow rate and the temperature rise of the cooling water. The power meter is calibrated to the power dissipation in the load computed by $$Q = \frac{dm}{dt} C(T_{out} - T_{in}),$$

where $$\frac{dm}{dt}$$

denotes the mass flow rate, C denotes the specific heat of water, and $T_{in}, T_{out}$ denote the inlet and outlet temperatures, respectively. A computer 324 acquires flow rate and temperature measurements to compute the power dissipation in the load and the difference (error) with respect to readout of the power meter. The computer 324 then applies this error as a correction to the power meter to complete the calibration.

Figure 9B:
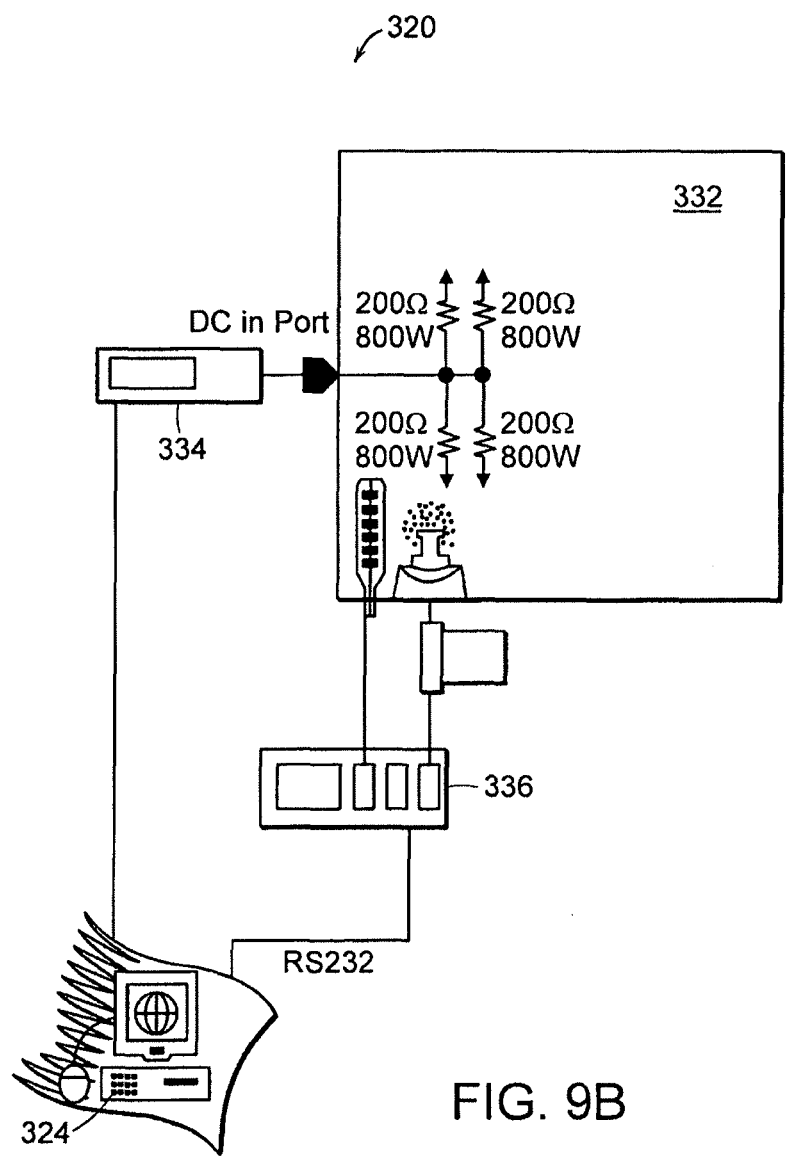
FIG. 9B is one embodiment for calibrating a load simulator to a DC power reference.

FIG. 9B is detailed implementation diagram of step 320 for calibrating the load simulator calorimeter 332. A load simulator calorimeter 332 is coupled to a DC power supply 334, DC power is applied, and the load simulator calorimeter 332 is calibrated. The DC power supply provides the DC power measurements. Using flow rate and temperature measurements at the inlet and outlet of the cooling system, a computer 324 computes the power dissipated in the load simulator. The computer 324 then applies the error between the power reported by the DC power supply and the power computed using calorimetry as a correction to the load simulator to complete the calibration.

Figure 9C:
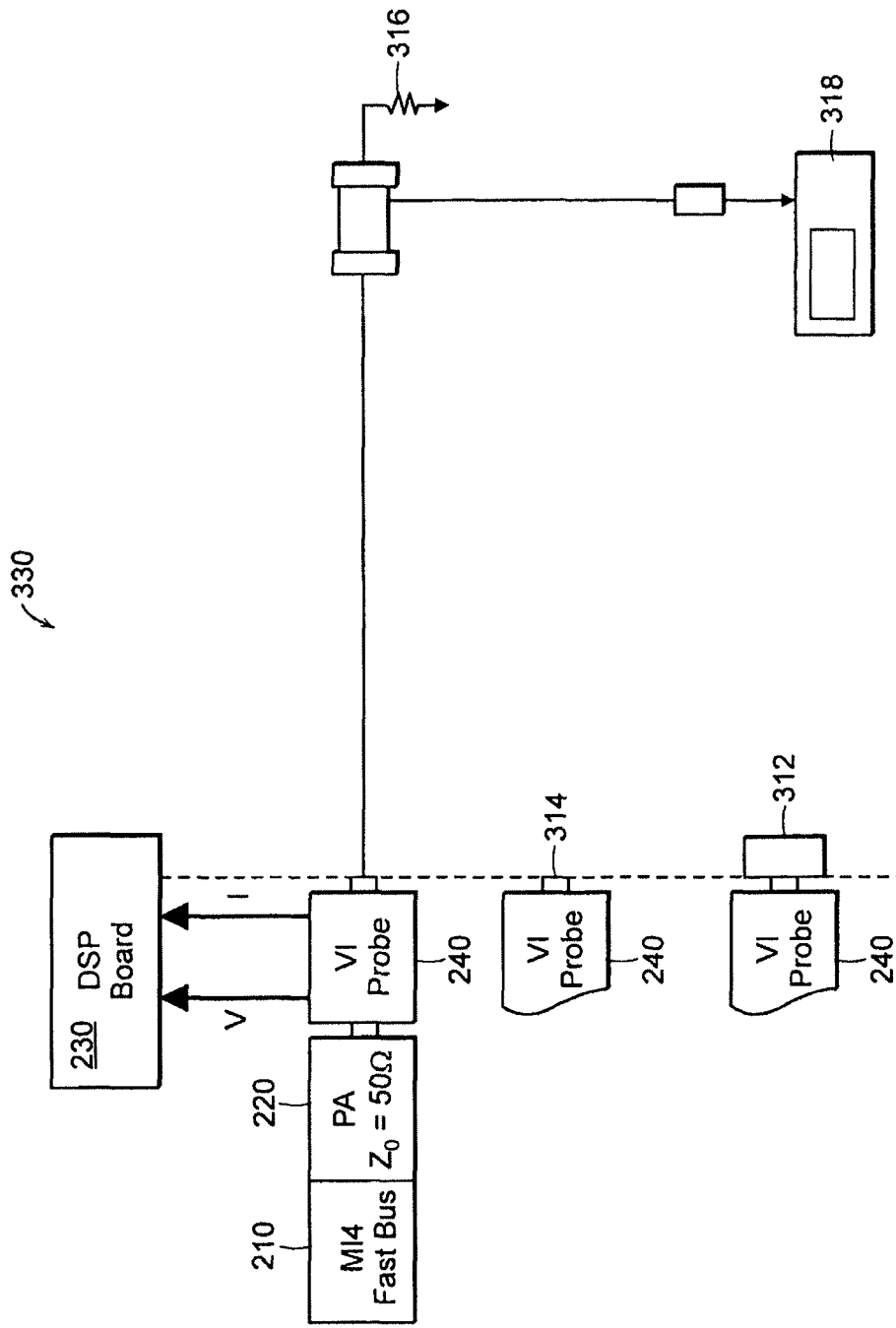
FIG. 9C is one embodiment for calibrating an RF impedance analyzer into a 50Ω load.
Figure 9D:
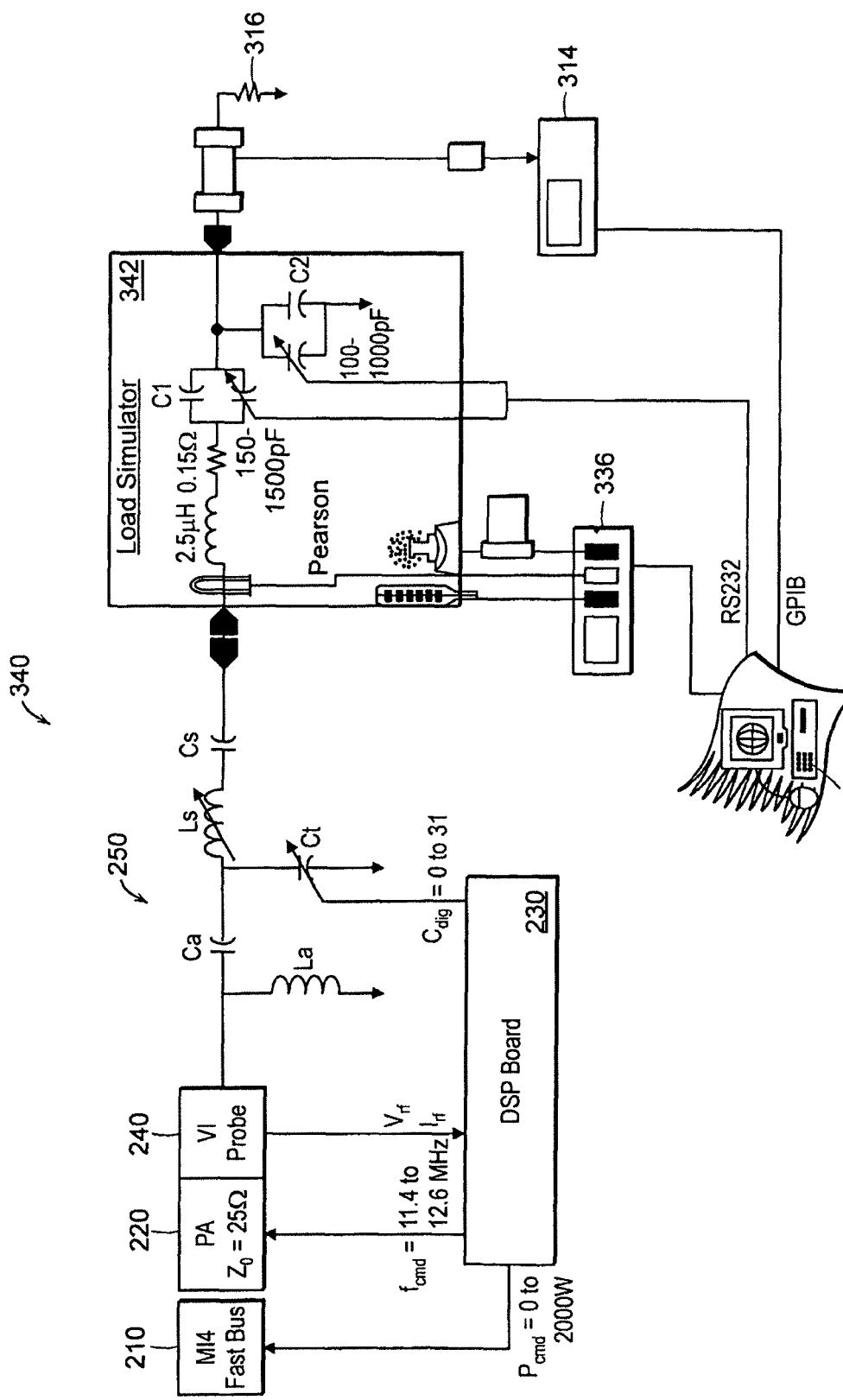
FIG. 9D is one embodiment for calibrating power delivered into the load simulator.

FIG. 9C is detailed implementation diagram step 330 for calibrating an RF impedance analyzer or VI probe 240. Generally, the VI Probe 240 calibration in each integrated RF generator system 200 includes the following steps that yield a matrix transfer function that relates the VI probe voltage and current measured by the DSP compensator board 230 to an actual RF line voltage and current.

First, a short circuit connector 312 is coupled to the RF line output terminal of the VI probe 240, RF power is applied from the power amplifier 220, and $Z_{sc}^{dsp}$ is computed, wherein $Z_{sc}^{dsp}$ is defined as the ratio of $V_{dsp}/I_{dsp}$ as measured by the DSP compensator board 230 for short circuit. Second, an open circuit connector 314 is coupled to the RF line output terminal of the VI probe 240, RF power is applied from the power amplifier 220, and $Z_{oc}^{dsp}$ is computed, wherein $Z_{oc}^{dsp}$ is defined as the ratio of $V_{dsp}/I_{dsp}$ as measured by the DSP compensator board 230 for open circuit. Third, a 50Ω load ($Z_L$) 316 is coupled to the output of the VI Probe 240, RF power is applied from the power amplifier 220, $V_m$ and $I_m$ are recorded and the RF line voltage $V_L$ is computed, wherein $V_L = \sqrt{P_L Z_L}$. $P_L$ is the delivered power measured by a power meter 318 at the 50Ω load 316. Lastly, the VI probe calibration matrix transfer function is computed by the following equation:

$$\begin{bmatrix} V_L(t) \\ I_L(t) \end{bmatrix} = \begin{pmatrix} \dfrac{V_L}{V_m - Z_{sc}^{dsp} I_m} & \dfrac{-Z_{sc}^{dsp} V_L}{V_m - Z_{sc}^{dsp} I_m} \\ \dfrac{-V_L}{Z_L \left( \dfrac{-Z_{oc}^{dsp} I_m -}{V_m} \right)} & \dfrac{Z_{sc}^{dsp} V_L}{Z_L \left( \dfrac{-Z_{oc}^{dsp} I_m -}{V_m} \right)} \end{pmatrix} \begin{bmatrix} V_{dsp}(t) \\ I_{dsp}(t) \end{bmatrix} \quad \text{EQN. 10}$$

The expression in equation 10 translates VI probe measurement signals into RF line voltage and RF line current at the output of the VI probe 240.

FIG. 9D is detailed implementation diagram step 340 for calibrating the system 200 (FIG. 2). The system level calibration is used to quantify the power loss in the electronic matching network 250 for a range of values matching network variables. A load simulator 342 is coupled to the output of the electronic matching network 250. Typically, the load simulator is an electronic matching network inverse to the electronic matching network 250. A 50Ω load is coupled to the output of the load simulator 342. The system-level calibration of the RF generator system 200 is performed as follows. First, a series inductance is adjusted in ll steps for $L_s \in [L_{s\ min}, L_{s\ max}]$. Second, a power setpoint value is changed in pp steps $P_{sp} \in [P_{sp\ min}, P_{sp\ max}]$ W. Third, a shunt capacitance setpoint value is changed in cc steps $C_{tcmd} \in [C_{tcmd\ min}, C_{tcmd\ max}]$. Lastly, an RF frequency value is changed in ff steps $f \in [f_{min}, f_{max}]$ Hz.

For each combination of the aforementioned steps, the load simulator 342 is set to present an impedance mismatch at the output of the electronic matching network 250. Next, RF power is applied from the power amplifier 220 and the power meter 314 measures the terminating load 312 resistance. The terminating load resistance is denoted by $P_{50\Omega}$ and transformed to the input of the load simulator 342. The simulated load is denoted by $P_{sys}$ as $P_{sys} = f_{50\text{-}to\text{-}sim}(P_{50\Omega}, C_1, C_2)$, where $C_1$ and $C_2$ represent the series and shunt capacitance of the load simulator and $f_{50\text{-}to\text{-}sim}$ represents a tabular arrangement. The losses associated in electronic matching network 250 is computed by the difference between the $P_L$ and $P_{50\Omega}$.

In some embodiments, a calibration table which has dimensions ll×pp×cc×ff can stored in non-volatile memory (e.g., flash memory) as $P_{sys} = f_{VI\text{-}to\text{-}sim}(L_s, P_{sp}, C_{tcmd}, f)$, where $f_{VI\text{-}to\text{-}sim}$ represents a tabular arrangement. High-speed real-time control loops necessitate fast searches through the calibration table during operation of the system 200. Non-volatile memory (e.g., flash memory) tends to be slower than the volatile memory (e.g., Dynamic RAM). The high-speed volatile memory is effectively utilized, wherein the arrangement of the calibration table (dimensions ll×pp×cc×ff) can be based on how frequently $L_s$, $P_{sp}$, $C_{tcmd}$, and f are changed. Specifically, the calibration table can be segmented into ll memory blocks; each block including pp memory pages; each memory page including a cc×ff dimensional table. A new memory block can be loaded into non-volatile memory when $L_s$ is changed, a new memory page can be loaded when power setpoint is changed, and calibration points for the appropriate memory page associated with $C_{tcmd}$ and f can be executed in real-time.

While this invention has been particularly shown and described with references to preferred embodiments thereof, it will be understood by those skilled in the art that various changes in form and details may be made therein without departing from the scope of the invention encompassed by the appended claims.

What is claimed is:

1. A system for delivering power to a dynamic load, comprising:
    a power supply providing DC power having a substantially constant power open loop response;
    a power amplifier for converting the DC power to RF power, the power amplifier having a frequency set point;
    a sensor for measuring voltage, current and phase angle between voltage and current vectors associated with the RF power;

an electrically controllable impedance matching system to modify the impedance of the power amplifier to at least substantially match an impedance of a dynamic load; and a controller comprising:
  a) a frequency control loop for controlling the frequency set point of the power amplifier based on a comparison of a conductance set point with a conductance value that is measured between the power amplifier and the dynamic load, and
  b) an impedance control loop that controls the electrically controllable impedance matching network such that susceptance and not conductance changes between the power amplifier and the dynamic load when the impedance of the power amplifier changes.

2. The system of claim 1, wherein the controller controls the electrically controllable impedance matching system for simultaneous control of conductance and susceptance associated with the impedance between the power amplifier and the dynamic load.

3. The system of claim 1, wherein the electrically controllable impedance matching system comprises an inductor, a capacitor in series with the inductor, and a plurality of switched capacitors in parallel with the dynamic load.

4. The system of claim 3, wherein the inductor is a multiple tap-type inductor or a variable-type inductor.

5. The system of claim 3, wherein each of the plurality of switched capacitors is in series with a switch and an additional capacitor.

6. The system of claim 1, wherein the electrically controllable impedance matching system comprises a capacitor, and a plurality of switched capacitors in parallel with the dynamic load, wherein each of the plurality of capacitors is in series with a switch and an additional capacitor.

7. The system of claim 1, wherein the controller simultaneously controls RF power frequency, RF power magnitude and the impedance between the power amplifier and the dynamic load.

8. The system of claim 1, wherein the electrically controllable impedance matching system controls the frequency of the impedance matching between the power amplifier and the dynamic load.

9. The system of claim 1, wherein the controller controls the electrically controllable impedance matching system for regulating conductance and susceptance to setpoints that stabilize an unstable dynamic load.

10. A method for delivering power to a dynamic load, comprising:
  providing DC power having a substantially constant power open loop response;
  converting the DC power to RF power through a power amplifier, the power amplifier having a frequency set point;
  measuring voltage, current and phase angle between voltage and current vectors associated with the RF power through a sensor; and
  modifying the impedance of the power amplifier to at least substantially match an impedance of a dynamic load with an electrically controllable impedance matching system such that only susceptance and not conductance changes between the power amplifier and the dynamic load when the impedance of the power amplifier changes; and
  controlling the frequency set point of the power amplifier based on a comparison of a conductance set point with a conductance value that is measured between the power amplifier and the dynamic load.

11. The method of claim 10, further comprising simultaneously controlling conductance and susceptance associated with the impedance between the power amplifier and the dynamic load.

12. The method of claim 10, further comprising simultaneously controlling RF power frequency, RF power magnitude and the impedance between the power amplifier and the dynamic load.

13. The method of claim 10, further comprising controlling the frequency of the impedance matching between the power amplifier and the dynamic load.

14. The method of claim 10, further comprising controlling the electrically controllable impedance matching system for regulating conductance and susceptance to setpoints that stabilize an unstable dynamic load.

15. The method of claim 10, further comprising calibrating the sensor into a resistive load.

16. The method of claim 10, further comprising calibrating an output of the electrically controllable impedance matching system into a load simulator.

17. A system for delivering power to a dynamic load, comprising:
  means for providing DC power having a substantially constant power open loop response;
  means for converting the DC power to RF power through a power amplifier, the power amplifier having a frequency set point;
  means for measuring voltage, current and phase angle between voltage and current vectors associated with the RF power through a sensor; and
  means for modifying the impedance of the power amplifier to at least substantially match an impedance of a dynamic load with an electrically controllable impedance matching system;
  means for controlling the frequency set point of the power amplifier based on a comparison of a conductance set point with a conductance value that is measured between the power amplifier and the dynamic load, and
  means for controlling the electrically controllable impedance matching network such that susceptance and not conductance changes between the power amplifier and the dynamic load when the impedance the power amplifier changes.

* * * * *